United States Patent [19]

Nellis et al.

[11] Patent Number: 4,762,754
[45] Date of Patent: Aug. 9, 1988

[54] DYNAMIC HIGH PRESSURE PROCESS FOR FABRICATING SUPERCONDUCTING AND PERMANENT MAGNETIC MATERIALS

[75] Inventors: William J. Nellis, Berkeley; M. Brian Maple, Del Mar; Theodore H. Geballe, Woodside, all of Calif.

[73] Assignee: The United States of America as represented by the United States Department of Energy, Washington, D.C.

[21] Appl. No.: 111,544

[22] Filed: Oct. 23, 1987

Related U.S. Application Data

[63] Continuation-in-part of Ser. No. 937,794, Dec. 4, 1986, Pat. No. 4,717,627.

[51] Int. Cl.⁴ .............................................. B22F 3/00
[52] U.S. Cl. .................................. 428/552; 228/107; 228/196; 419/8; 419/9; 419/61; 419/66; 428/565; 428/632
[58] Field of Search .................. 428/552, 565, 632; 419/8, 9, 61, 66; 228/107, 196

[56] References Cited

U.S. PATENT DOCUMENTS

| | | | |
|---|---|---|---|
| 4,255,374 | 3/1981 | Lemcke | 419/66 |
| 4,325,895 | 4/1982 | Morris | 419/66 |
| 4,490,329 | 12/1984 | Hare et al. | 419/51 |
| 4,497,873 | 2/1985 | Barker | 428/547 |
| 4,618,537 | 10/1986 | Takano et al. | 428/694 |
| 4,649,073 | 3/1987 | Suzuki et al. | 428/212 |
| 4,664,963 | 5/1987 | Sakai et al. | 428/179 |
| 4,717,627 | 1/1988 | Nellis et al. | 428/552 |

Primary Examiner—Stephen J. Lechert, Jr.
Attorney, Agent, or Firm—Berthold J. Weis; Clifton E. Clouse; Judson R. Hightower

[57] ABSTRACT

Shock wave formation of superconductive ceramic oxide electric and magnetic circuit elements with improved microstructures and mechanical properties.

32 Claims, 5 Drawing Sheets

DYNAMIC HIGH PRESSURE PROCESS FOR FABRICATING SUPERCONDUCTING AND PERMANENT MAGNETIC MATERIALS

The U.S. Government has rights in this invention pursuant to Contract No. W-7405-ENG-48 between the U.S. Department of Energy and the University of California, for the operation of Lawrence Livermore National Laboratory.

This application is a continuation-in-part of our patent application Ser. No. 06/937,794 filed Dec. 4, 1986, now U.S. Pat. No. 4,717,627.

FIELD OF THE INVENTION

This invention relates to preparation, using shock wave propagation, of solid materials with new superconducting and permanent magnetic properties.

BACKGROUND OF THE INVENTION

Certain solid materials manifest desirable electrical or magnetic properties when thin samples, of thicknesses from one micrometer (microns or $\mu m$) to ten millimeters (mm), are prepared and used. One problem with some of these materials is that their preparation is not straightforward, but requires slow and costly techniques and often produces such materials in very small volume. The invention described and claimed herein provides relatively inexpensive method and apparatus for preparing these materials in reasonable volume.

SUMMARY OF THE INVENTION

One object of the invention is to provide method and apparatus to form materials of thickness a few microns or more that have saturation magnetic fields of five kilo-oersteds or greater.

Another object is to provide method and apparatus to form new solid materials of thickness a few microns or more that have superconducting critical magnetic fields of at least 150 kilogauss and may be embedded in a metallic medium.

Another object of the invention is to provide a process for making useful electric and magnetic circuit elements from the recently discovered superconducting ceramic oxide materials.

Other objects of the invention, and advantages thereof, will become clear by reference to the detailed description and the accompanying drawings.

To achieve the foregoing objects, in accordance with the invention, the method in one embodiment (for powders) may comprise: providing three planar layers of materials, with layer #2 containing a powder containing one or more predetermined constituents and being contiguous to and positioned between layers #1 and #3 along the two exposed planar surfaces of #2, and with layers #1 and #3 being predetermined solid metallic materials; providing a rigid planar surface contiguous with one of the planar surfaces of layer #3 so that layer #3 lies between layer #2 and the rigid planar surface; providing a supersonic shock wave that passes through layers #1, #2 and #3 in that order; confining the three-layer assembly on all sides so that the assembly withstands boundary deformation pressures of up to 1 Megabar; allowing the powder in layer #2 to at least partially melt and coalesce into a higher density layer; and allowing the excess thermal energy in layer #2 to rapidly flow into the adjacent layers #1 and #3.

The method in another embodiment (for films and bulk materials) may comprise: providing three planar layers of materials, with layer #2 containing a film or bulk material that contains one or more predetermined constituents and is contiguous to and positioned between layers #1 and #3 along the two exposed planar surfaces of #2, and with layers #1 and #3 being predetermined solid metallic materials; providing a rigid planar surface contiguous with one of the planar surfaces of layer #3 so that layer #3 lies between layer #2 and the rigid planar surface; providing a supersonic shock wave that passes through layers #1, #2 and #3 in that order; confining the three-layer assembly on all sides so that the assembly withstands boundary deformation pressures of up to 1 Megabar; and allowing the excess thermal energy in layer #2 to rapidly flow into the adjacent layers #1 and #3.

A salient aspect of the present invention relates to the production of practical electrical and magnetic circuit elements using the recently discovered class of ceramic oxide superconductors. In particular, these materials are characterized by the general formula $X\ Ba_2\ Cu_3\ O_{7-e}$, where e is between zero and about 0.5, and X may be yttrium or a rare earth, although cerium, preseodymium, prometheum or terbium have not been shown to exhibit superconducting properties. This first class of superconducting oxides is the most important, because their critical temperature, below which the material is superconducting, is above the boiling point of liquid nitrogen. While a definitive theory of superconductivity is still not available, it is thought that a key feature which renders these materials superconductive is the perovskite type crystal lattice, which provides zero resistance electronic pathways along the oxygen positions in the crystal lattice. A slight oxygen deficiency and electron excess appear important. It has also been reported that the superconducting state can be achieved by minor substitutions of oxygen by fluorine and chlorine, which presumably supply excess electrons.

The present method also applies to a second class of superconducting oxide materials, i.e., $(La_{1-x}\ A_x)_2\ Cu\ O_{4-e}$, where A may be strontium or barium, x is between 0.01 and 0.2 and e is a small number less than one. These materials have not shown superconductivity above the boiling point of liquid nitrogen, however. Another material is $La_{3-y}Ba_{3+y}Cu_6\ O_{14+e}$ which is superconducting below 90° K., and e is between 0.01 and $\sim 1$ and y is between 0 and 1.

In general, the present invention contemplates to produce useful conductors and circuit elements made of these materials by similar shock compression techniques as generally discussed herein. In particular, the invention provides a method for producing conductors comprising superconducting cores or multiple filaments of the above enumerated ceramic oxide materials embedded in and surrounded by a metallic conductive matrix or cladding. A loose composite of conductive metal layers surrounding a layer comprising powdered superconducting ceramic oxides is exposed to a transverse shock wave which will compact and bond the powdered superconducting material into a monolithic solid, and also to the adjacent metallic conductor. The preferred magnitude of the shock wave is so chosen that it will generate pressures causing transient heating and melting at the grain boundaries of the superconducting material to consolidate the powdered material. Heat is rapidly diffused from the melt region at the boundaries of the particles into the cooler main body of the particles and into the conductive metal layers so that the superconducting properties of the powder are not destroyed. The metal layer also becomes part of the final magnetic or electric circuit element, providing back-up conductivity, mechanical support and strength.

DETAILED DESCRIPTION OF THE PREFERRED EMBODIMENT

The invention relies in part on the following experimental observations, which are confirmed by theoretical calculations utilizing measured shock wave equation-of-state data: (1) When a metallic solid is compressed by a shock wave of given strength, the resulting rise in temperature is only 10-20 percent of the resulting temperature rise where a powder of the same solid is compressed (and melted) by a shock wave of the same strength; (2) Where a thin layer of metallic powder is compressed, heated and melted by a shock wave and the resulting mass is contiguous on at least one side with a metal layer at much lower temperature, the majority of heat loss or cooling of the higher temperature material will occur by flow of heat to the contiguous metal layer rather than by flow to any adjacent material. As used herein, a "layer" of powder will refer to either a thin sheet or a line of such powder. A shock wave propagated through any powder with density of the order of 50 percent of solid density will produce a material of much higher temperature than the temperature of the equivalently shocked solid material.

Figure 1:
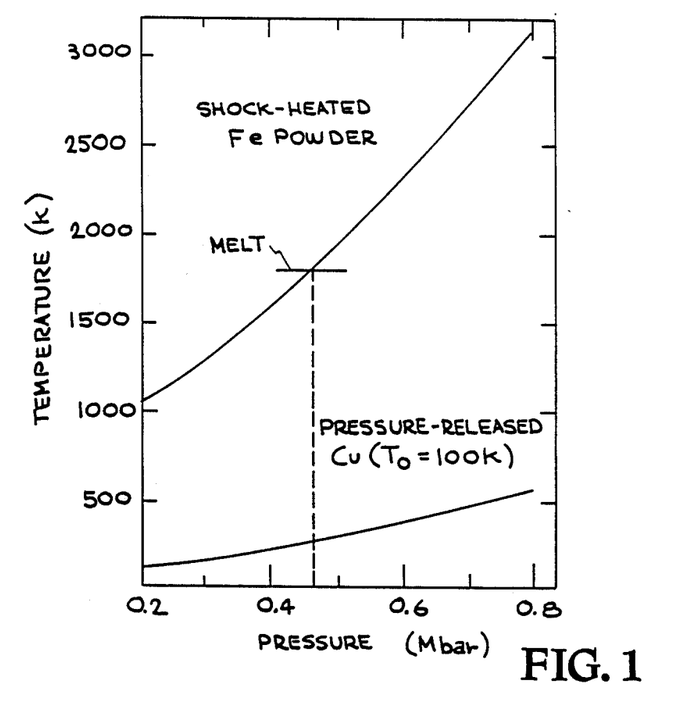
FIG. 1 is a graphic view of calculated residual temperature, as a function of maximum shock wave pressure, after passage of a shock wave through two representative materials, solid Cu and Fe powder (initial average density $\rho = 4.8$ gm/cm$^3$), both with initial temperature T=100° K., where the Fe powder is assumed to be initially embedded in the Cu.

As an example, FIG. 1 exhibits the calculated residual temperature $T_r$ (after pressure release) reached in shock-heated Fe powder, initially of average density $\rho = 4.8$ gm/cm$^3$ and at temperature $T_0 = 100°$ K., and in solid Cu as a function of the maximum pressure $P_m$ generated in the material by the shock wave. For $P_m$ 0.47 Mbar in this Fe powder encapsulated in solid Cu, $T_r$ exceeds $T_{melt}(Fe) \approx 1800°$K. and the powder melts and coalesces. At this point, the temperature $T_r$ in solid Cu may be approximately 300° K. The temperature $T_r(Fe)$ is quenched by rapid temperature equilibration between the Fe and the contiguous Cu.

Figure 2:
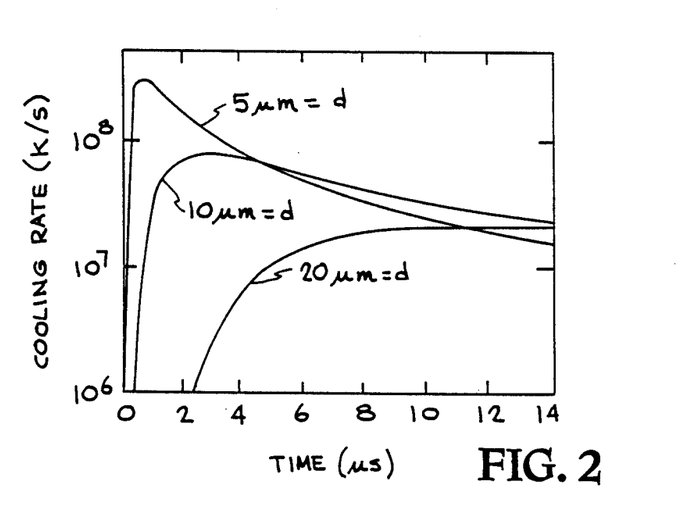
FIG. 2 is a graphic view of calculated cooling rate, at various depths d, of a planar layer of Fe powder that has been compressed by passage of a 0.5 Mbar shock wave through the Cu and the powder layer.

FIG. 2 is a graphic view of calculated cooling rates ($10^{6°}$-$10^{9°}$ K./sec) versus time for shock heated Fe power ($P_{max} = 0.55$ Mbar) contiguous with solid Cu, for various depths d within the Fe material. At smaller depths than d<5 $\mu$m within the Fe, the cooling rate may exceeds $10^{9°}$ K/sec.; this rate peaks within a few hundred nanoseconds and subsequently falls to a rate below the rates extant at greater depths. The high cooling rates available near the Fe-Cu interface in Fe are believed to produce fine-grain crystalline or amorphous Fe (or other material) processed in this manner; this belief is based upon the fabrication of amorphous and fine-grain Fe alloys by the well-known melt spinning method, with a maximum quench rate of about $10^{6°}$ K/sec. This fine-grain structure is required for superconductors with high critical magnetic fields and high critical electrical currents and for permanent magnetic materials with high coercivities ($\approx$ five kilo-oersteds and greater). The effectively uniaxial nature of the shock pressure pulse produces a preferred crystalline orientation that is useful for producing permanent magnetic materials. High temperatures are achieved in a confined specimen (constrained on all boundaries) at high pressure so that mixtures of materials with greatly differing volatilities can be combined without losing the more volatile constituents.

Superconducting materials for high magnetic fields and high electrical current are embedded in a metallic medium (e.g., Cu or Al) in order to provide thin, superconducting layers with sufficient strength to withstand the large electromagnetic forces present in a high field superconducting magnet and to provide a controlled, nondestructive current path, if the material undergoes a transition from superconducting state to normal state. The process described herein embeds synthesised materials in a metallic matrix, and the resulting composite may then be used for high-field superconducting magnet applications. This technique is also useful for synthesising new superconducting materials, using very fast thermal and pressure quench rates.

Figure 3:
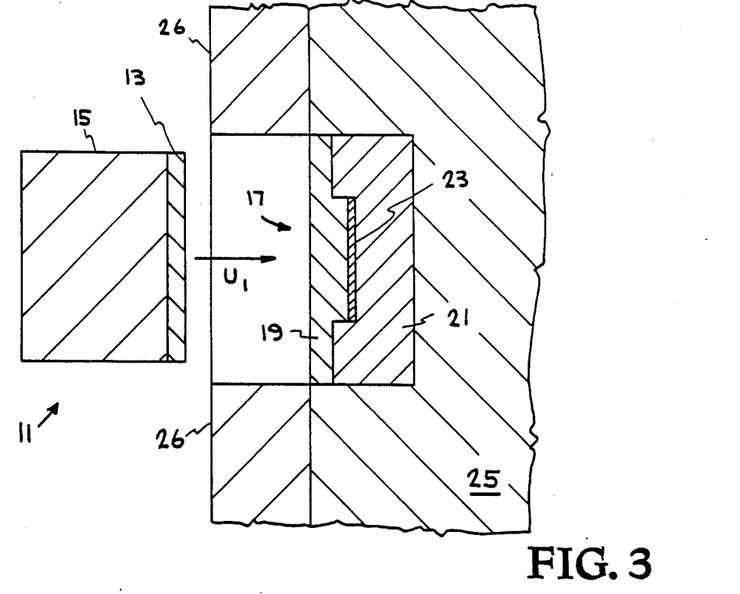
FIG. 3 is a schematic view of one embodiment of apparatus suitable for practicing the invention for powder specimens.

One embodiment of apparatus to accomplish the dynamic high pressure compaction and quenching of the powder, shown in FIG. 3, uses a projectile 11 comprising a metal impactor 13 (Cu, Al, etc.) with a ductile backing material 15 of plastic or other suitable material to attenuate the rearward-moving shock wave after impact. The plastic also serves to hold the metal impactor during the impactor's acceleration by a gas gun. The projectile 11 is initially caused to move at supersonic speed toward a target 17 that includes a first substantially planar sheet 19 of Cu, Al, steel or similar material, and a parallel second solid planar sheet 21 of a similar material, with a thin planar layer or line 23 of the powder positioned between and contiguous with the solid layers 19 and 21 as shown. Hereafter, the phrase "transversely contiguous", applied to two or more planar layers of material, will mean that these layers are parallel to and contiguous to one another along a common plane that defines each of the planar layers. A strong back-up layer 25, of steel or other suitable material, is positioned parallel to and transversely contiguous to the rear exposed surface of the second solid planar layer 21, in order to constrain layers 19, 21 and 23 at their external boundaries and to dissipate part or all of the shock wave energy after the wave passes once through the planar layers 19, 23 and 21. As shown in FIG. 3, the back-up material 25 wraps around the sides of layers 19, 21 and 23 to constrain lateral deformation. Lead or some other heavy material 26 is preferably positioned at the sides of the target adjacent to the plane of impact, leaving clearance for passage of the projectile, to prevent this surface from "blowing out" as the pressure waves travel outward from the impact area.

The projectile 11 impacts an exposed, parallel, planar surface of the first planar layer or sheet 19, at a velocity of substantially 0.2–4 km/sec. The shock wave generated in the first planar layer moves progressively through the powder layer 23, the second solid planar layer 21 and the back-up layer 25; and the powder in layer 23 is melted and caused to coalesce for sufficiently high shock pressures.

Figure 4:
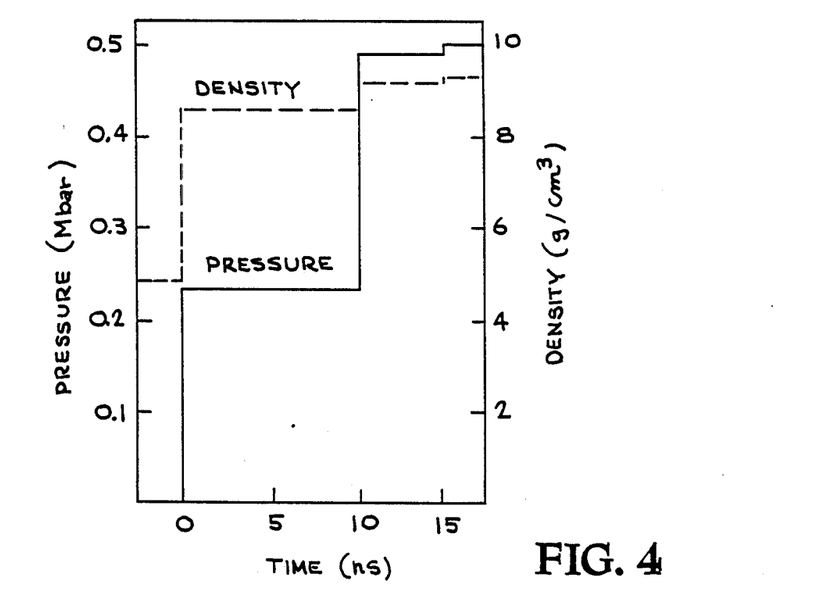
FIG. 4 is a graphic view of pressure and density, as a function of time, sensed by a planar layer of Fe powder as a 0.5 Mbar shock wave passes from the Cu through the powder layer, initially 50 $\mu$m thick.

The powder layer 23 may initially have a material average density of substantially 50 percent of theoretical solid density and may have a thickness of 10–500 $\mu$m. The energy deposition time in the powder layer is small, 3–100 nsec., compared to the time, 100–500 nsec., that the powder layer is held at that pressure to react chemically. The time intervals that the powder materials are held at high temperatures and pressures may be controlled by varying the thickness and width of the impactor plate. FIG. 4 indicates that, for initial powder layer density $\rho_o(Fe)=4.8$ gm/cm$^3$, the density after passage of the shock wave reaches $\rho(Fe)=9.2$ gm/cm$^3$ for a 0.55 Mbar pressure shock wave; this latter density is 1.2 times crystal density and may induce formation of a new solid phase when the molten layer quenches to a solid state.

Figure 6:
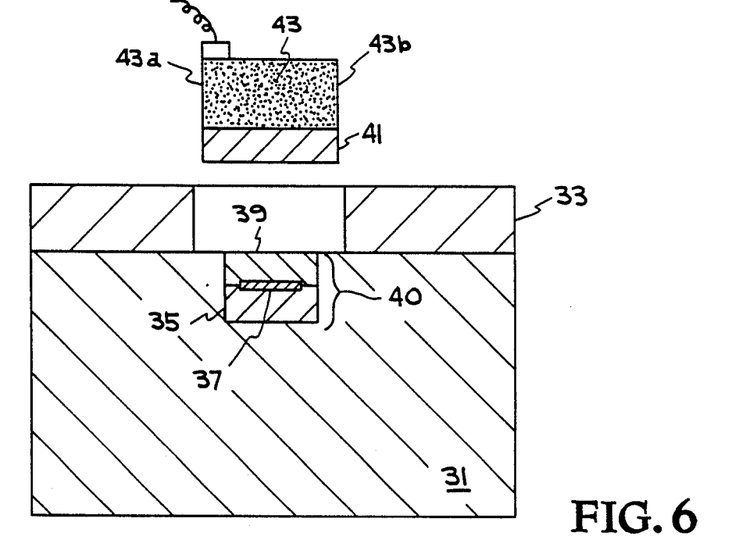
FIG. 6 is a schematic cutaway view of an alternative approach to shock wave generation in the powder layer, using a technique related to explosive welding.

Alternatively, the embodiment shown in FIG. 3 may be replaced by one in which the first Cu layer 13 is positioned (stationary) at the target 17 and the projectile 11 includes a planar impactor 41 of steel or other suitable material, backed by a layer of a suitable high explosive 43 that is detonated to move the projectile against the target, as shown in FIG. 6. By detonating the explosive at one end, a travelling detonation wave in the explosive generates a travelling pressure wave that forces the projectile plate against the target. In this manner, large lengths or areas of such materials can be synthesized and embedded in Cu or other ductile material.

The bulk materials (e.g., Cu, Al, steel) surrounding and contiguous with the powder may be 1–10 mm thick. These materials may be pre-cooled to temperatures of the order of 80°–100° K., to reduce the residual temperature attained by such material after passage of the shock wave therethrough and to thereby increase the powder-bulk material temperature difference and specimen temperature quench rate. Since the shock wave amplitude and residual temperature each attenuate as the wave moves away from the impact area, pre-cooling also provides a heat sink for rapid cooling close to the specimen, irrespective of the residual shock temperature of the specimen. For certain applications, the initial temperature may be increased to several hundred degrees Kelvin to synthesize a new product at lower shock wave pressure and/or permit post-shock annealing to achieve a desired grain size or microstructure.

For pressures that are less than required for complete melting of the powder layer, shock powder particles will melt primarily on the surfaces thereof and fuse together when the interstitial regions quench to the solid state. A fine-grain microstructure is required for superconductors with high critical magnetic fields and high critical electrical currents, and for permanent magnetic materials with high coercivities (5–20 kilo-oersteds). These can be obtained by varying the shock pressure and temperature to vary crystallite chemical composition, structure, size and orientation, as well as the multiplicity of phases induced in the compacted powder. These features are important for pinning superconductor flux lines in superconductors and magnetic flux lines in hard permanent magnets. Thus, shock wave pressures varying from the minimum required to barely compact a powder into a monolithic layer, up to that required to totally melt and thermally quench the powder particles, are important for synthesis here. Suitable powder materials for preparing superconducting materials with high critical magnetic fields include: Pb/Mo/S, Eu/Mo/S, Sn/Eu/Mo/S, Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr. Suitable materials for preparation of permanent magnetic material with high coercivity include: Sm/Co, Fe/B/x and Fe/B/x/y, where the materials x and y are drawn from a group including Nd, Pr, Sm, Eu, Co and Ni.

FIG. 6 illustrates an alternative approach to generation of shock waves in the powder layer, using a technique related to explosive welding of two plates. The purpose of this technique is to use explosives to fabricate arbitrarily long lengths or large areas of the desired material. One provides, as usual, a back-up plate 31 (steel or such) and an impact cushion layer 33 of Pb or similar high density material at the side of the impact area; first and second planar layers 39 and 35 of Cu or similar material, with a thin layer of powder 37 sandwiched between these two layers; an impactor plate 41 spaced apart from the three-layer sandwich 40; and a layer 43 of high explosive positioned to detonate and drive the impactor plate against the three-layer sandwich 40. The high explosive 43 is detonated at one end 43A, and the detonation front proceeds toward the other end 43B. As the detonation front advances longitudinally from one end 43A to the other end 43B, successive portions of the impactor plate are driven against the three-layer sandwich, producing a rolling motion of impactor plate 41 against the sandwich 40. This produces a travelling high pressure shock wave in the layers 35, 37 and 39 that again causes the layer 37 of powder particles to partially or fully melt and to fuse together as desired. This technique is used in explosive welding, where the object is to weld the impactor plate and the adjacent plate together. Here, the object is to drive long lengths or large areas of the layers 35, 37 and 39 together; and the choice of shock wave pressures and other parameters may differ from the choices for "pure" explosive welding.

We have performed dynamic compaction experiments on two representative powder compounds, 51 weight percent Cu/49 weight percent Zr and $Pb_{1.2}Mo_6S_8$, to assess the effect of shock pressure on the final structure of the material. For the Cu/Zr compound, 160 kbar shock pressure produced a compacted mixture, with some melting of the powder particle boundaries but with some voids still showing; application of 600 kbar shock pressure produced a very fine grain structure with no trace of the original individual powder particles. Application of 160 kbar shock pressure to the much harder Pb/Mo/S compound left large voids, with many of the original powder particles being observable and little or no melting of powder particle boundaries; shock pressure of 600 kbar produced a fine grain structure and some evidence of melting, but with some large voids.

The invention for processing films or bulk specimens relies in part on the following observations, which are confirmed by experiments and theoretical calculations utilizing measured shock wave equation-of-state data.

(1) When a material is subjected to high pressure and temperature, it is possible to induce a new crystal structure that is more stable at the higher pressures and densities. If sufficiently high temperature is also present, the rate of transformation to the new phase is increased substantially; if the specimen can be quenched sufficiently quickly, a metastable, high pressure crystal will result. Because shock pressures and the resulting temperature rises can be applied and released extremely quickly (in times less than a microsecond), shock waves are useful for promoting irreversible (on shock wave time scale) transformations to synthesize and quench metastable materials.

(2) When a ductile metallic solid, such as Cu, Al, steel or similar material, is compressed by a shock wave of a given strength, this material is also heated by the shock wave. However, such materials remain ductile at high pressure and do not undergo phase transitions at such pressures. Such materials can thus be used as capsules to contain materials that are more brittle; these latter materials can be shock-synthesized to produce metastable superconducting or permanent magnetic materials. The shock pressures and temperatures attained in the ductile materials are comparable to the pressures and temperatures attained in the more brittle specimens embedded in the ductile materials.

(3) Maximum shock pressures and temperatures can be localized to the specimen and the portion of the (ductile) capsule immediately adjacent to the specimen. As the shock wave moves away from the specimen, the shock heating attenuates with increasing distance and leaves the specimen surrounded by a cooler heat sink region.

(4) When the maximum shock pressure of the specimen is released, the reversible portion of the shock internal energy is given up, and the specimen temperature decreases at a rate up to $10^{9°}$ K. per second. The remaining thermal energy is removed quickly by thermal diffusion to the surrounding heat sink.

(5) After the layer of superconducting or permanent magnetic material (the "specimen material") has been shock-compressed and heated in this manner, some of the shock wave energy can be absorbed in an irreversible transformation to a new phase of the material, with a correspondingly smaller portion of the shock wave energy being available for dynamic heating of the material before flow of this heat to any contiguous layer of adjacent material.

(6) After removal of the shock wave pressure, the ductile material will recover to substantially its original material state, but the specimen material may retain its new state, with a new phase and possibly higher density than that of the original specimen material. In this manner, metastable materials can be shock synthesized.

As an example, FIG. 1 exhibits the calculated residual temperature $T_r$ (after pressure release) reached in shock-heated solid Cu, initially at temperature $T_0=100$ ° K., as a function of the maximum pressure $P_m$ generated in the material by the shock wave. For Cu shocked at $P_m=0.74$ Mbar and 0.98 Mbar, the temperatures $T_r$ are estimated at 500°K. and 800° K., respectively. Where a Nb film is shocked in a similar manner, the tempertures $T_r$ for $P_m=0.74$ Mbar and 0.98 Mbar are estimated as 650° K. and 1000° K., respectively.

The fast dynamic deformation process can produce a fine grain structure in the specimen material. This fine-grain structure is required for superconductors with high critical magnetic fields and high critical electrical currents and for permanent magnetic materials with high coercivities ($\approx$ five kilo-oersteds and greater). The effectively uniaxial nature of the shock pressure pulse produces a preferred crystalline orientation that is useful for producing permanent magnetic materials. High temperatures are achieved in a confined specimen (constrained on all boundaries) at high pressure so that mixtures of materials with greatly differing volatilities can be combined without losing the more volatile constituents.

Figure 7:
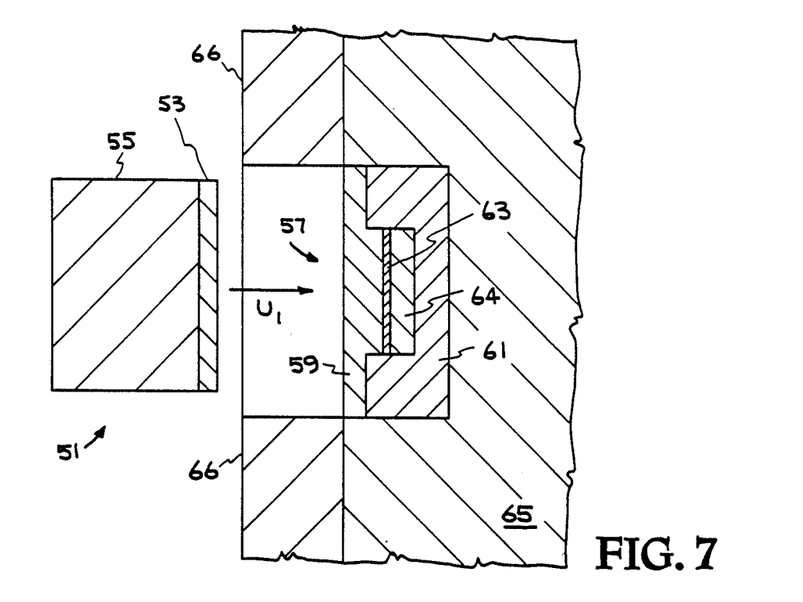
FIGS. 7 and 8 are schematic views of embodiments of apparatus suitable for practicing the invention, using film (with a substrate) or bulk specimens.
Figure 8:
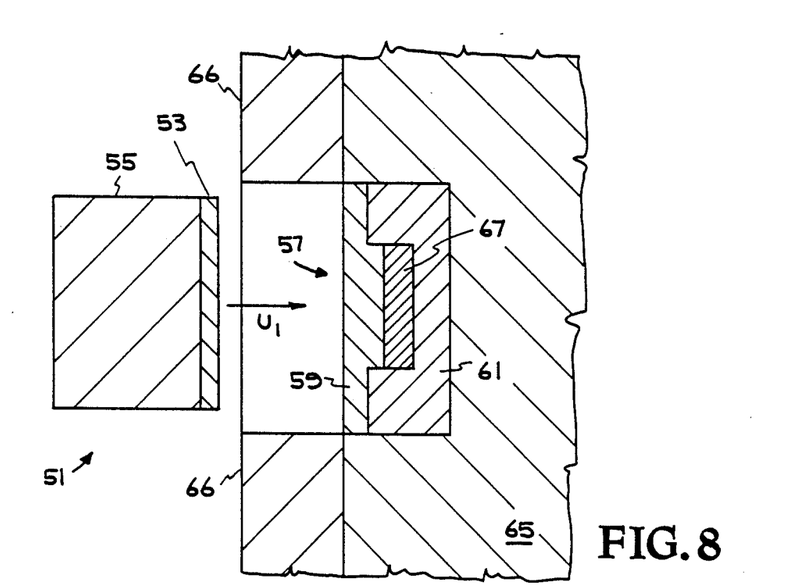

One embodiment of apparatus to subject films and bulk specimens to dynamic high pressures, shown in FIGS. 7 and 8, uses a projectile 51 comprising a metal impactor 53 (Cu, Al, etc.) with a ductile backing material 55 of plastic or other suitable material to attenuate the rearward-moving shock wave after impact. The plastic also serves to hold the metal impactor during the impactor's acceleration by a gas gun. The projectile 51 is initially caused to move at supersonic speed toward a target 57 that includes a first substantially planar sheet 59 of Cu, Al, steel or similar material, and a parallel second solid planar sheet 61 of a similar material, with a planar layer of film or bulk material 63 (and a film substrate 64 of Cu, steel, sapphire or such, where a film specimen is to be processed) of the specimen material positioned between and contiguous with the solid layers 59 and 61 as shown. A strong back-up layer 65, of steel or other suitable material, is positioned parallel to and transversely contiguous to the rear exposed surface of the second solid planar layer 61, in order to constrain layers 59, 61 and 63 at their external boundaries and to dissipate part or all of the shock wave energy after the wave passes once through the planar layers 59, 63 and 61. As shown in FIG. 7, the back-up material 65 wraps around the sides of layers 59, 61, 63 and 64 to reduce lateral deformation.

The projectile 51 impacts an exposed, parallel, planar surface of the first planar layer or sheet 59, at a velocity of substantially 0.2–4 km/sec. A shock wave generated in the first planar layer 59 moves progressively through the layers 63, 61 and 65; and the specimen material in layer 63 undergoes a permanent phase transition for sufficiently high pressures. An optional Pb block positioned to the side provides further stability.

The specimen material layer 63 may initially have a material average density of substantially 100 percent of theoretical solid density and may have a thickness of 1–$10^4$ μm. The time intervals that the specimen material is held at high temperatures and pressures may be controlled by varying the thickness and width of the impactor plate.

The bulk materials (e.g., Cu, Al, steel) surrounding and contiguous with the specimen material may be 0.1–10 mm thick or more. These materials may be pre-cooled to temperatures of the order of 80°–100°K., to reduce the residual temperature attained by such material after passage of the shock wave therethrough and to thereby increase the ductile-specimen material temperature difference and specimen temperature quench rate. Because the shock wave amplitude and residual temperature each attenuate as the wave moves away from the impact area, pre-cooling also provides a heat sink for rapid cooling close to the specimen material, irrespective of the residual shock temperature of that material. For certain applications, the initial temperature may be increased to several hundred degrees Kelvin to synthesize a new product at lower shock wave pressure and/or permit post-shock annealing to achieve a desired grain size or microstructure.

A fine-grain microstructure is required for superconductors with high critical magnetic fields and high critical electrical currents, and for permanent magnetic materials with high coercivities (5–20 kilo-oersteds). These features are important for pinning superconductor flux lines in superconductors and magnetic flux lines in hard permanent magnets. Suitable specimen materials for preparing superconducting materials with high critical magnetic fields include: Pb/Mo/S, Eu/Mo/S, Sn/Eu/Mo/S, Pb/Eu/Mo/S, La/Eu/Mo/S, Sn/Mo/S, Sn/Al/Mo/S, Nb/N, Mo/N, V/Si, Nb/Si, Nb/Ge, Nb/Al/Ge, Nb/Al, Nb/Ga, Nb/Ti and Nb/Zr. Suitable materials for preparation of permanent magnetic material with high coercivity include: Sm/Co, Fe/B/x and Fe/B/x/y, where the materials x and y are drawn from a group including Nd, Pr, Sm, Eu, Co and Ni.

Figure 9:
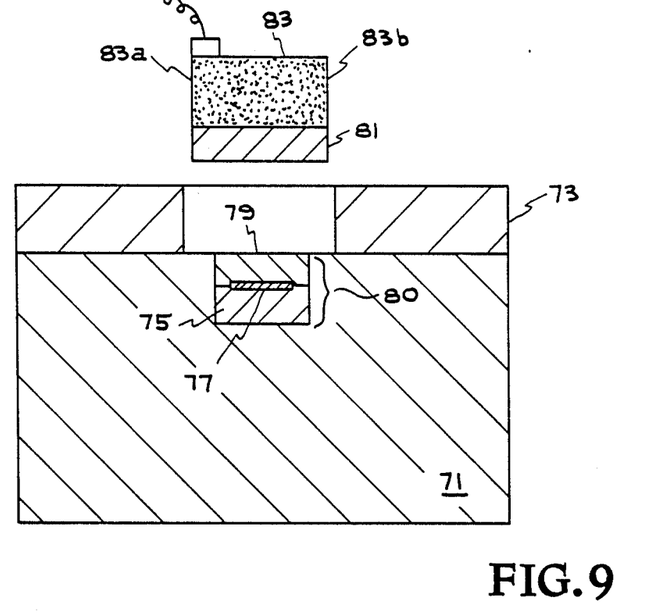
FIG. 9 is a schematic view of a second embodiment of apparatus suitable for practicing the invention, using film or bulk specimens.

FIG. 9 illustrates an alternative approach to generation of shock waves in the specimen material layer, using a technique related to explosive welding of two plates. One provides, as usual, a back-up plate 71 (steel or such) and an impact cushion layer 73 of Pb or similar high density material at the side of the impact area; first and second planar layers 75 and 79 of Cu or similar material, with a layer of specimen material 77 sandwiched between these two layers; an impactor plate 81 spaced apart from the three-layer sandwich 80; and a layer 83 of high explosive positioned to detonate and drive the impactor plate against the three-layer sandwich 80. The high explosive 83 is detonated at one end 83A, and the detonation front proceeds toward the other end 83B. As the detonation front advances longitudinally from one end 83A to the other end 83B, successive portions of the impactor plate are driven against the three-layer sandwich, producing a rolling motion of impactor plate 81 against the sandwich 80. This produces a travelling high pressure shock wave in the layers 75, 77 and 79 that again causes the layer 77 of specimen material to undergo a phase transition, as desired. This technique is used in explosive welding, where the object is to weld the impactor plate and the adjacent plate together. Here, the object is to drive the layers 75, 77 and 79 together; and the choice of shock wave pressures and other parameters may differ from the choices for "pure" explosive welding.

To demonstrate the method, apparatus similar to that indicated in FIG. 8, has been applied to bulk polycrystalline Nb specimens, 13 mm in diameter by 9 mm thickness, at maximum shock pressures of 0.6 Mbar, 1.0 Mbar and 1.2 Mbar. The critical temperature for manifestation of superconductivity, $T_c$, was found to decrease weakly with increasing shock pressure, from 9.18°K. for the unshocked specimen to 9.155°K. at the highest shock pressure. Maximum increase of Vickers hardness, from 75 (unshocked) to 130–150, was observed for the 0.6 Mbar specimen, and long thin grain structures were induced in specimen planes perpendicular to the direction of propagation of the shock waves.

Figure 5:
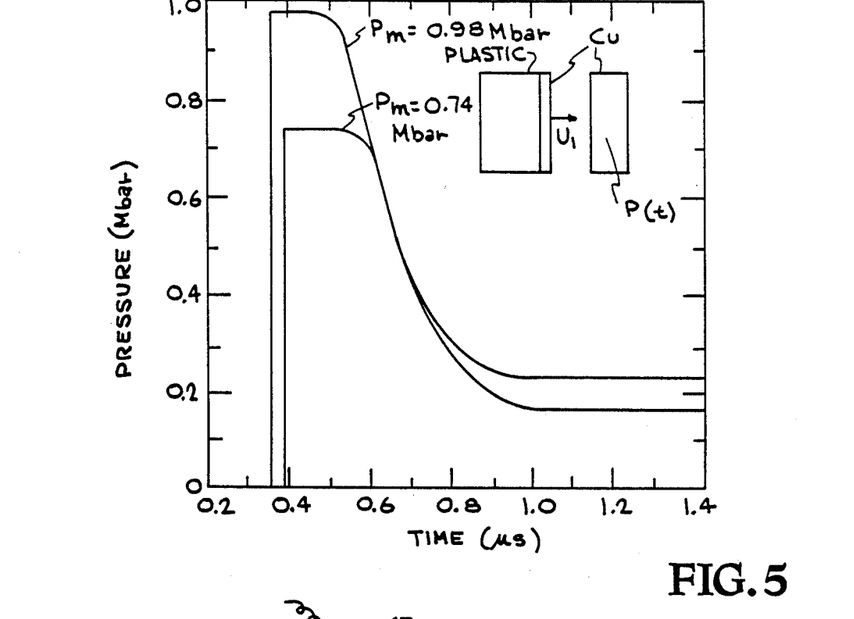
FIG. 5 is a graphical view of pressure versus time within a shocked Cu-Fe powder-Cu sandwich or embedded Nb film, for two experiments at calculated peak pressures of 0.74 Mbar and 0.98 Mbar (impact velocities of 2.76 and 3.38 km/sec, respectively), produced by a Cu impactor 1 mm thick. The structure in the pressure rise illustrated in FIG. 4 also occurs during the initial rise shown in FIG. 5, but the time scale is too compressed to reveal this.

Next, several Nb films, each about 30 $\mu$m thick, were deposited simultaneously on Cu substrates that were 10 mm (diameter) by 1 mm (thickness). A Cu plate of 2.5 mm thickness was placed over the Nb films, and this target was subjected to shock waves induced with Cu impactor velocities of 2.76 and 3.38 km/sec; these produced shock pressures of 0.74 Mbar and 0.98 Mbar, respectively. The higher impactor velocity was chosen to produce a maximum pressure close to the pressure (0.9 Mbar) that is predicted to produce maximum shock-induced hardness and defect concentration in the pure Nb film. Calculated shock wave pressure histories for the two experiments are those of FIG. 5. For these two situations, the predicted peak shock temperatures are 1200°K. and 1900°K., respectively; upon release of the material to zero pressure, these temperatures decrease to 850°K. and 1200°K., respectively. The shock process is thermodynamically irreversible so that the material temperature does not revert to room temperature after the pressure is released. The corresponding temperatures for the solid Cu substrate and capsule are lower than for Nb.

In these experiments, the first stage of cooling, which occurs upon isentropic release to the backing pressure provided by the plastic (=0.2 Mbar in FIG. 5), occurs in about 300 nsec; this corresponds to a bulk thermodynamic cooling rate of about $10^9$ °K./sec. The second stage of cooling occurs by conduction of heat from the Nb film to the contiguous Cu substrate and capsule on two sides of the specimen and ductile material; the time required for this to occur is estimated at tens of microseconds.

Optical photomicrographs of the Nb film embedded in the surrounding Cu material show a final Nb film thickness of about 20 $\mu$m (reduced from 30 $\mu$m as a result of late-time plastic flow) with reasonably well defined Nb-Cu interfaces for the 0.74 Mbar experiment. For the higher peak pressure of 0.98 Mbar, the Cu penetrates completely through the Nb film at some locations; here the Cu recrystallizes to smaller grain size than in the Cu substrate itself. The Nb specimens before and after the shock treatment manifested substantially the same critical temperature, $T_c$. Critical temperature for Nb is thus relatively insensitive to shock treatment below one Mbar, but Vickers hardness is increased by about 100 percent. This method allows access to previously-unexplored regions of high density phase regions.

In the above-described experiments with Nb, the superconducting transition temperature is changed only modestly, about 0.1°K. out of 9.4°K., by the shock process. The upper critical magnetic field $H_{c2}$, however, is increased by a factor of about two over the corresponding field for annealed Nb; this is caused by the shock-induced defects.

Discs of $Nb_3Si$, 1.5–2 mm thick and 12 mm in diameter and cut from arc-melted buttons, were successfully recovered for applied shock wave pressures of 0.82

Mbar and 0.96 Mbar. The specimen subjected to 0.96 Mbar pressure was found to contain a substantial amount of A15-phase $Nb_3Si$ with 5.09 A lattice parameter. The electrical resistance of the processed specimen goes abruptly to zero at temperature $T_c=18°K$. The specimen material retained its superconducting transition even after postshot "powdering", indicating that the superconductivity was induced throughout the bulk of the specimen. The electrical resistance of the specimen shocked at 0.82 Mbar pressure did not completely vanish at temperature $T=18°K$.

An amorphous film of $Nb_3Si$, shocked to 0.72 Mbar, was observed to contain small ($\lesssim 1000$ A diameter) polycrystals of A15-phase, which is the superconducting phase of this compound.

Figure 10:
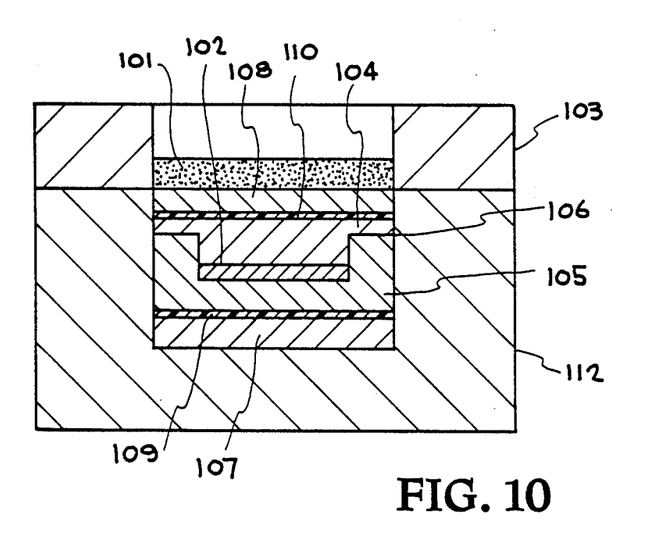
FIG. 10 is a schematic cross-sectional view of a preferred arrangement for producing ceramic oxide superconductors.

FIG. 10 shows an exemplary arrangement for producing superconductor components from the powdered superconducting ceramic oxides enumerated above. The figure shows a layer of explosive 101 as the source of the shock wave for carrying out the present process. It should be understood, that the shock wave may be generated by other means, such as one-or-two stage gas guns, rail guns, explosive or otherwise driven flyer plates and the like. However, sheet explosive is readily available commercially and offers an ability to produce products of large sizes, particularly long and narrow geometries, which is important for producing long conductors.

Sheet explosive is available in the form of long strips delivering a travelling wave shock exposure to its adjacent regions. The nature of the explosive and its thickness are chosen to determine desired peak pressures and shock duration respectively. These are the most important processing parameters which determine the degree of heating of the powder sample, both in intensity and duration. Hence the type of explosive and its thickness determine how much the granular material will melt. The present method offers the versatility to cause compaction without melting, to cause the material to melt at the grain boundaries only, as well as to cause complete melting of the entire powdered sample 102. It is again important to realize that the entire process is highly transitory and that the heat is dissipated away from the melt region of the granular sample to its surroundings—which may also be cooled to enhance heat flow—at extremely high rates, i.e., $10^6$ °K./sec.

There is a limit to the pressures which can be delivered by a particular explosive 101 disposed immediately adjacent to the upper surface of the composite sample, i.e., as shown in FIG. 10. Higher pressures can be generated by arrangements shown in FIG. 9, i.e., by driving a flyer plate through a free run region with higher explosives. High explosives and their properties are described in the *LLNL Explosives Handbook*, UCRL-52997, Brigitte M. Dobratz, Mar. 16, 1981.

There is an upper limit to both magnitude of peak pressure as well as pulse duration of the shock delivered to the specimen, determined by the degree of decomposition caused by the shock treatment of the superconductor particles. To some extent, these effects can be offset by compensating the anticipated oxygen loss by excess oxygen incorporated in the material prior to shock processing, or, alternatively, by including an oxygen donor substance in the particle mixture. One such compound is $Au_3O_2$ which would decompose under shock loading to provide oxygen to the superconducting oxides while the Au would be chemically inert and play the role of conducting metal.

The shocking process is best carried out in the presence of a shock dissipative backing environment comprised for example by steel channel 112 and lead collar 103, whose function it is to confine the shocked sample and to conserve its geometry and shape.

The superconducting element to be produced comprises a central core or cores or multiple filaments of superconductor, formed by compression of powdered superconducting ceramic oxides as discussed above, encased or embedded in a conductive metal matrix, such as copper, silver, steel or aluminum, which plays the dual function of providing mechanical support and protection for the core, as well as capacity to conduct electricity, which becomes important, should discontinuities or other failures disrupt continuity in the superconducting core and to provide good alternative electrically conducting current paths should the superconductor suddenly transition from the superconducting to the nonsuperconducting state while conducting electrical current. The conductive metal casing is formed in the course of shock compression of separate conductive metal layers 104 and 105. Because the conductive metal layers are the same materials, they will weld together along joints 106 and form a tight seal.

The powdered ceramic oxide comprises particle sizes generally between $1-100\mu$ micrometers and preferably from 5 to $25\mu$. Another relationship relates to powder layer thickness and particle size, particularly relevant for compositions intended to be formed by rapid melting and resolidification along the intergranular surface contact loci. It is preferred that compacted composites are formed from powders whose maximum particle size is less than about 20% of the unshocked powder layer thickness, preferably 5-20%.

For structural and conductivity reasons, the ceramic oxide powder may be mixed with a fraction of powdered conductive metal used for the outer conductor layers. The ceramic oxide powder should comprise 30% or more by volume of the oxide - metal powder mixture. The benefit of doing so is that the metal will help fill interstices, and hence help bond the superconducting particles together, as well as improving the bond between the core and the outer conductor.

It may be desirable to form conductor or circuit elements, whose final thickness is less than the minimum thickness of the product which may be attained using the present shock compaction process. For such situations the final size is produced by conductor material removal, i.e., mechanical machining, grinding, and the like or by chemical conductor material removal, i.e., chemical etching with acid. Another method, however, is to provide the starting metal layer thicknesses dictated by shock compression parameters by providing double layers of conductive metal. FIG. 10 shows these as layers 107 and 108, respectively, whose thicknesses are such that the combined thickness adds up to satisfy the process requirements. To obviate additional material removal process steps, thin mylar as adhesive layers 109 and 110 are provided to prevent the layers from bonding together and permit the excess conductors to be peeled off.

Although the preferred embodiments have been shown and described herein, variation and modification may be made without departing from the scope of the invention.

We claim:

1. In a method for producing superconducting electric and magnetic circuit components, the steps comprising:
   disposing powdered superconducting ceramic oxide between sheets of conductive metal in a shock dissipative backing environment;
   generating a supersonic shockwave generally normal to planes of said sheets of conductive metal and said layer of ceramic oxide to thereby compact said powdered ceramic oxide into a densified superconducting body having superconducting current paths therethrough enclosed in and integral with said sheets of conducting metal.

2. The method of claim 1, further including the step of separating the composite of said superconducting body and conductive metal from said backing environment.

3. The method of claim 1 wherein said superconducting ceramic oxide is selected from the group consisting of $X\,Ba_2\,Cu_3\,O_{7-e}$, where X may be Y, Nd, Sm, Eu, Gd, Dy, Ho, Er, Tm, Yb, and Lu and where O may be partially replaced by F or Cl, and where e is a small number less than 1.

4. The method of claim 1, wherein said superconducting ceramic oxide is selected from the group consisting of $(La_{l-x}\,A_x)_2\,Cu\,O_{4-e}$, where A may be Sr or Ba and $0.01 \lesssim X \lesssim 0.25$ and e is a small number less than 1 and $La_{3-y}\,Ba_{3+y}\,Cu_6\,O_{14+e}$ where e is a small number less than 1 and y is between 0 and 1.

5. The method of claim 1, wherein said shock wave generates pressures within said layer of powdered ceramic oxide, the magnitude of said pressure being sufficient to substantially reduce void space between adjacent grains of superconducting ceramic oxide, and to transiently cause rapid melting and resolidification at boundaries of said adjacent grains, thereby bonding adjacent grains together, without decomposing said superconducting ceramic oxide.

6. The method of claim 5, wherein the magnitude of said pressures is between 10 and 400 kb.

7. The method of claim 1 wherein the maximum grain size of said superconducting ceramic oxide is between 5 and 20% of the thickness of the unshocked layer of superconducting ceramic oxide.

8. The method of claim 1 wherein said conductive metal is copper, silver, steel or aluminum.

9. The method of claim 1 wherein said supersonic shockwave is generated by means of a gas gun.

10. The method of claim 2 wherein said shockwave is generated by means of explosives disposed adjacent to the surface of said conductive metal opposite said backing environment.

11. The method of claim 10 wherein said explosive is sheet explosive.

12. The method of claim 11 further defined in that said sheet explosive and said conductive metal are in the form of ribbons of much greater length than width.

13. The method of claim 2 further defined in that said shock dissipative backing environment is steel.

14. The method of claim 1 wherein said supersonic shockwave is generated by electromagnetic launchers.

15. The method of claim 1 further defined in that the thickness of said sheet of conductive metal is greater than the desired circuit component thickness, and final component thickness is produced by removal of a portion of the conductive metal.

16. The method of claim 15 wherein the conductive metal is removed by chemical etching.

17. The method of claim 16 wherein the conductive metal is removed mechanically.

18. The method of claim 15 wherein desired starting thickness of conductive metal sheets is produced by providing double layers of predetermined individual thicknesses, and wherein the final conductor thickness is produced by peeling off the outer layer of said conductive metal.

19. The method of claim 18 wherein said double layers are separated by a plastic coating.

20. The method of claim 1 wherein said layer of powdered superconducting ceramic oxide also includes powdered conductive metal particles.

21. The method of claim 20 wherein said powdered conductive metal particles have the same chemical identity as said sheets of conductive metal, and about the same particle sizes as said powdered superconducting ceramic oxide particles.

22. The method of claim 20 wherein the fraction of said powdered conductive metal is between 0 and 70% by volume of said powdered particles.

23. The product produced by the method of claim 1.

24. An article of manufacture, comprising shock compressed superconducting ceramic oxide sealed in an outer casing of conductive metal.

25. The article of claim 24 wherein said superconducting ceramic oxide is selected from the group consisting of $X\,Ba_2\,Cu_3\,O_{7-e}$, where X may be Y, Nd, Sm, Eu, Gd, Dy, Ho, Er, Tm and Yb, and Lu and where O may be partially replaced by F or Cl, and where e is a small number.

26. The article of claim 24 wherein said superconducting ceramic oxide is selected from the group consisting of $(La_{l-x}\,Ax)_2\,Cu\,O_{4-e}$, where A may be Sr or Ba and $0.01 \lesssim X \lesssim 0.25$ and e is a small number less than 1 and $LaBa_{3+y}\,Ba_{3+y}\,Cu_6\,O_{14+e}$ where e is a small number less than 1 and y is between 0 and 1.

27. The article of claim 24 wherein said shock compressed superconducting ceramic oxide includes metallic conductor particles.

28. The article of claim 27 wherein said metallic conductor particles comprise up to 70% by volume of the total volume of particles.

29. The article of claim 24 wherein said conductive metal is silver, copper, steel, and aluminum.

30. The method of claim 1, wherein said layer of powdered superconducting ceramic oxide is pretreated to provided excess oxygen to compensate for oxygen lost during exposure to said supersonic shockwave.

31. The method of claim 30, wherein said layer is pretreated by admixing an oxygen donor capable of emitting oxygen during shock compression.

32. The method of claim 31, wherein said oxygen donor is $Au_3O_2$.

* * * * *

REEXAMINATION CERTIFICATE (1572nd)
United States Patent
[11] B1 4,762,754

Nellis et al.

[45] Certificate Issued  Oct. 15, 1991

[54] DYNAMIC HIGH PRESSURE PROCESS FOR FABRICATING SUPERCONDUCTING AND PERMANENT MAGNETIC MATERIALS

[76] Inventors: William J. Nellis, 471 Cragmont Ave., Berkeley, Calif. 94708; M. Brian Maple, 478 Zuni Dr., Del Mar, Calif. 92014; Theodore H. Geballe, 259 Kings Mountain Rd., Woodside, Calif. 94062

Reexamination Request:
No. 90/001,605, Oct. 4, 1988

Reexamination Certificate for:
Patent No.: 4,762,754
Issued: Aug. 9, 1988
Appl. No.: 111,544
Filed: Oct. 23, 1987

Related U.S. Application Data

[63] Continuation-in-part of Ser. No. 937,794, Dec. 4, 1986, Pat. No. 4,717,627.

[51] Int. Cl.$^5$ .............................................. B22F 3/00
[52] U.S. Cl. ................................... 428/552; 228/107; 228/196; 419/8; 419/9; 419/61; 419/66; 428/565; 428/632
[58] Field of Search ...................... 428/552, 565, 632; 228/107, 196; 419/8, 9, 61, 66

[56] References Cited
U.S. PATENT DOCUMENTS
3,752,665  8/1973  Roy et al. ............................ 75/135

OTHER PUBLICATIONS

Murr et al., Metal-Matrix High-Temperature Superconductors, *Adv. Mat & Processes*, vols. 132 & 4, pp. 36–44, 10/87.

Murr et al., Shock Induced Microstructures in Explosively Fabricated Superconductors, *J.P. Metals*, vol. 40, pp. 19–23, 1/88.

Nellis, Shock-Compression Ultrapressure Research, *Scripta Metallurgica*, vol. 22, pp. 121–125, 2/88.

Bergman, et al., Effect of Explosive Shock Wave on Ceramic Powders *J. of Am. Ceramic Soc.*, vol. 49, #9, pp. 502–507, 8/66.

Nellis et al, Synthesis of Metastable Superconductors by High Dynamic Pressure, *SDID*, vol. 878, pp. 2–9, 1988.

Nellis et al, Novel Preparation Methods for High Tc Oxide Superconductors *MRS Bulletin*, vol. XIV, #1, pp. 63–66, 1/89.

Johnson, et al., *Scripta Metallurgica*, vol. 22, pp. 1689–1693, 1988.

Material Science Research, vol. 17; "Emergent Process Methods for High-Technology Ceramics", Davis et al, pp. 621–748, 1984.

Material Science Research, Extended Abstracts; "High Temperature Superconductors", Gubser et al, pp. 219–221, Apr. 23–24, 1987.

Japanese Journal of Applied Physics, vol. 26, No. 5, May 1987, pp. L865–L866, "Critical Current Density of Wire Type Y–Ba–Cu Oxide Superconductor", Yamada et al.

Shock-compression Fabrication of High-temperature Superconductor/metal Composite Monoliths; Murr et al; Nature, vol. 329; Sep. 3, 1987.

*Primary Examiner*—Stephen J. Lechert, Jr.

[57] ABSTRACT

Shock wave formation of superconductive ceramic oxide electric and magnetic circuit elements with improved microstructures and mechanical properties.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 2, lines 18–40:

A salient aspect of the present invention relates to the production of practical electrical and magnetic circuit elements using the recently discovered class of ceramic oxide superconductors. In particular, these materials are characterized by the general formula $X\ Ba_2\ Cu_3\ O_{7-e}$, *where O may be partially replaced with F or Cl,* where e is between zero and about 0.5, and X may be yttrium or a rare earth, although cerium, preseodymium, prometheum or terbium have not been shown to exhibit superconducting properties. [This] *The* first class of superconducting oxides is the most important, because their critical temperature, below which the material is superconducting, is above the boiling point of liquid nitrogen. While a definitive theory of superconductivity is still not available, it is thought that a key feature which renders these materials superconductive is the perovskite type crystal lattice, which provides zero resistance electronic pathways along the oxygen positions in the crystal lattice. A slight oxygen deficiency and electron excess appear important. It has also been reported that the superconducting state can be achieved by minor substitutions of oxygen by fluorine and chlorine, which presumably supply excess electrons.

Column 2, lines 41–49:

The present method also applies to a second class of superconducting oxide materials, i.e., $(La_{1-x}\ A_x)_2\ CuO_{4-e}$, *where O may be partially replaced with F or Cl,* where A may be strontium or barium, x is between 0.01 and [0.2] *0.25* and e is a small number less than one. These materials have not shown superconductivity above the boiling point of liquid nitrogen, however.

Another material is $La_{3-y}Ba_{3+y}Cu_6O_{14+e}$ *where O may be partially replaced with F or Cl,* which is superconducting below 90° K., and e is between 0.01 and ~1 and y is between 0 and 1.

AS A RESULT OF REEXAMINATION, IT HAS BEEN DETERMINED THAT:

The patentability of claims 1, 2, 5–14, 20–24 and 27–32 is confirmed.

Claims 3, 4, 15, 25 and 26 are determined to be patentable as amended.

Claims 16, 17, 18 and 19, dependent on an amended claim, are determined to be patentable.

3. The method of claim 1 wherein said superconducting ceramic oxide is selected from the group consisting of $X\ Ba_2\ Cu_3$ [O] $Z_{7-e}$, [where] *wherein* X [may be] *is selected from the group consisting of* Y, Nd, Sm, Eu, Gd, Dy, Ho, Er, Tm, Yb, and Lu and where [O may be] *Z is O or O* partially replaced by F or Cl, and where e is a small number less than 1.

4. The method of claim 1, wherein said superconducting ceramic oxide is selected from the group consisting of $(La[\ ]_{1-x}A_x)_2\ Cu\ O_{4-e}$, where A [may be] *is* Sr or Ba and $0.01 \lesssim X \lesssim 0.25$ and e is a small number less than 1 and $La_{3-y}Ba_{3+y}Cu_6O_{14+e}$ where e is a small number less than 1 and y is between 0 and 1.

15. The method of claim 1 further defined in that the thickness of said sheet of conductive metal is greater than [the] *a* desired circuit component thickness, and final component thickness is produced by removal of a portion of the conductive metal.

25. The article of claim 24 wherein said superconducting ceramic oxide is selected from the group consisting of $X\ Ba_2\ Cu_3$ [O] $Z_{7-e}$, wherein X [may be] *is selected from the group consisting of* Y, Nd, Sm, Eu, Gd, Dy, Ho, Er, Tm, [and] Yb, and Lu and where [O] Z is O or O [may be] partially replaced by F or Cl, and where e is a small number *less than one.*

26. The article of claim 24 wherein said superconducting ceramic oxide is selected from the group consisting of $(La[\ ]_{1-x}A[x]_x)_2\ Cu\ O_{4-e}$, where A [may be] *is* Sr or Ba and $0.01 \lesssim X \lesssim 0.25$ and e is a small number less than 1and La[Ba]$_{3[+]-y}Ba_{3+y}Cu_6O_{14+e}$ where e is a small number less than 1 and y is between 0 and 1.

* * * * *